US006941541B2

(12) United States Patent
Snider

(10) Patent No.: US 6,941,541 B2
(45) Date of Patent: Sep. 6, 2005

(54) EFFICIENT PIPELINING OF SYNTHESIZED SYNCHRONOUS CIRCUITS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 18 days.

(21) Appl. No.: 10/775,945

(22) Filed: Feb. 10, 2004

(65) Prior Publication Data

US 2004/0163053 A1 Aug. 19, 2004

Related U.S. Application Data

(63) Continuation of application No. 10/198,940, filed on Jul. 19, 2002, now abandoned.

(51) Int. Cl.[7] .............................................. G06F 17/50
(52) U.S. Cl. .................................. 716/18; 716/3; 716/6
(58) Field of Search .............................. 716/1–3, 6, 10, 716/16, 18; 703/19

(56) References Cited

U.S. PATENT DOCUMENTS

| 6,453,446 B1 | * | 9/2002 | van Ginneken | ................. 716/6 |
| 2003/0126580 A1 | * | 7/2003 | Kurokawa et al. | ............ 716/18 |

OTHER PUBLICATIONS

C. Leiscrson, J. Saxe, "Retiming Synchronous Systems." Algorithmica, 6(J), 1991.
C. Leiscrson, "Systolic and Semisystolic Design," IEEE International Conference on Computer Designs / VLSI in Computers, 1983.

H. Touati, R. Brayton, "Computing the Initial States of Retimed Circuits," IEEE Transactions on Computer–Aided Design of Integrated Circuits and Systems, vol. 12, No. 1 Jan. 1993.
K. Eckl, J. Madre, P. Zepter, C. Legal, "A Practical Approach to Multiple–Class Retiming," *Proceedings of the 36th AMC/IEEE Conference on Design Automation*, 1999.
V. Singhal, S. Malik, R. Brayton, "The Case for Retiming with Explicit Reset Circuitry," International Conference on Computer–Aided Design, 1996.
B. Rau, "Iterative Modulo Scheduling," HP Labs Technical Report HPL–94–115, Nov. 1995.
M. Papaefthymiou, "Understanding Retiming through Maximum Average–Weight Cycles," Proceedings of the Third Annual ACM Symposium onn Parallel Algorithms and Architectures, 1991.
S. Kundu, L. Huisman, I. Nair, V. Iyengar, "A Small Test Generator for Large Designs," International Test Conference, 1992.

(Continued)

*Primary Examiner*—Matthew Smith
*Assistant Examiner*—Paul Dinh

(57) ABSTRACT

Method and apparatus for generating a pipelined synchronized circuit representation of a program loop. A dependence graph is generated from the program loop. The dependence graph represents operations and registers and connections therebetween. A minimum clock period and initiation interval are determined from the dependence graph. Until a scheduled graph is successfully generated, repeated attempts are made to generate a scheduled graph from operations and registers of the dependence graph using the minimum clock period and the initiation interval. With each failed attempt to generate a scheduled graph, the minimum clock period is increased prior to the next attempt to generate a scheduled graph.

19 Claims, 6 Drawing Sheets

OTHER PUBLICATIONS

C. Leiserson, J. Saxe, "Optimizing Synchronous Systems," Journal of VLSI and Computer Systems, vol. 1, No. 1, 1983.

N. Shenoy, R. Rudell, "Efficient Implementation of Retiming," 1994 IEEE/ACM International Conference on Computer–aided Design, 1994.

P. Pan, G. Chen, "Optical Retiming for Initial State Computation," $12^{th}$ International Conference on VLSI Design, Jan. 1999.

M. Wolfe, M. Lam, "A Loop Transformation Theory and Algorithm to Maximize Parallelism," IEEE Transactions on Parallel and Distributed Systems, vol. 2, No. 4 Oct. 1991.

M. J. Wolfe, "More Iteration Space Tiling," Proceedings of Supercomputing 89, 1989.

S. Hassoun, C. Ebeling, "Architectural Retiming: Pipelining Latency–Constrained Circuits," $33^{rd}$ Design Automation Conference, 1996.

D. Maydan, J. Hennessy, M. Lam, "Efficient and Exact Data Dependence Analysis," Proceedings of the ACM SIGPLAN '91 Conference on Programming Language Design and Implementation, 1991.

S. Mahike, "Exploiting Instruction–level Parallelism in the Presence of Conditional Branches," Ph.D. Dissertation, University of Illinois, Sep. 1996.

J. Tiernan, "An Efficient Search Algorithm to Find the Elementary Circuits of a Graph," Communication of the ACM, vol. 13 No. 12, Dec. 1970.

T. Callahan, J. Warwrzynek. "Adapting Software Pipelining for Reconfigurable Computing," Proceedings of the International Conference on Compilers, Architectures, and Synthesis for Embedded Systems, Sep. 2000.

M. Gokhale, J. Stone. E. Gomersall, "Co–synthesis to a Hybrid RISC/FPGA Architecture," Journal of VLSI Signal Processing Systems for Signal Image and Video Technology, vol. 24, No. 2, Mar. 2000.

R. Schreiber, S. Aditya, B. Rau, V. Kathali, S. Mahike, S. Abraham. G. Snider "High–Level Synthesis of Nonprogrammable Hardware Accelerators," HP Labs Technical Report HPL–2000–31, 2000.

V. Srinivasan, R. Vemuir, "A Retiming Base Relaxation Heuristic for Resource–Constrained Loop Pipelining," Proceedings of the Eleventh International Conference on VLSI Design: VLSI for Signal Processing, 1998.

P. Calland, A. Darte. Y. Robert, "Circuit Retiming Applied to Decomposed Software Pipelining." IEEE Transactions on parallel and Distributed Systems, vol. 9, No. 1, Jan. 1998.

M. Weinhardt, W. Luk, "Pipeline Vectorization," IEEE Transactions on Computer–Aided Designs of Integrated Circuits and Systems, vol. 20, No. 2, Feb. 2001.

T. O'Neil, S. Tongsima, E. Sha. "Optimal Scheduling of Data Flow Graphs Using Extended Retiming," Proceedings of the ISCA $12^{th}$ International Conference on Parallel and Distributed Computing Systems, 1999.

J. Monteiro, S. Devadas, P. Ashar, A. Mauskar, "Schedulig Techniques to Enable Power Mangement," $33^{rd}$ Design Automation Conference, 1996.

H. Yun, J. Kim "Power–Aware Modulo Scheduling for High–Performance VLIW Processors." International Symposium on Low Power Electronics and Design, 2001.

E. Musoll, J. Cordatella "Scheduling and Resource Binding for Low Power, "Proceedings of the International Symposium on System Synthesis, 1995.

* cited by examiner

EFFICIENT PIPELINING OF SYNTHESIZED SYNCHRONOUS CIRCUITS

CROSS REFERENCE TO RELATED APPLICATION(S)

This is a continuation of application Ser. No. 10/198,940 filed on Jul. 19, 2002 now abandoned which is hereby incorporated by reference herein.

FIELD OF THE INVENTION

The present invention generally relates to mapping software program loops to a hardware implementation.

BACKGROUND

Software-implemented designs, or parts thereof, are sometimes re-implemented in hardware for cost and performance reasons. Program loops within the software are synthesized in hardware as synchronous circuits that include interconnected logic units and registers that are synchronously clocked. A general objective is for the synthesized circuit to execute with as much throughput as possible. This is useful in embedded computation where a loop-based algorithm might be too compute-intensive to be implemented on a conventional, sequential processor and requires a custom circuit (which could be implemented in an FPGA) in order to meet some minimum performance constraint.

One strategy for accelerating loops (either in hardware or software) is to pipeline overlapping successive iterations of the loop in time so that the overall execution time of the loop is reduced. Issues of resource allocation and scheduling must be addressed in pipelining. Allocation involves assigning (and sharing when necessary) limited resources to implement the computation. Scheduling involves orchestrating the resources in time and space to efficiently implement the overlapped iterations without interference between different parts of the computation.

If the two sub-problems can be decoupled, pipelining can be implemented easily by first doing the allocation, then the scheduling. More often, however, the problems are coupled and must be solved at the same time. This coupling arises when pipelining computations on sequential processors from the fixed number of registers and function units that must be timeshared in order to implement the computation. This is less of an issue in reconfigurable (or custom) hardware because the number of function units and registers is usually not restricted ahead of time. Allocation issues do arise in FPGAs, however, when using limited resources such as read and write ports on internal RAMs.

Two techniques that address the issues of resource allocation and scheduling include "retiming" and "iterative modulo scheduling." Retiming is a transformation on synchronous circuits that moves registers within a circuit while preserving the circuit's behavior with respect to its primary inputs and outputs. In particular, the latency of the circuit is preserved. Retiming has at least three limitations. First, retiming assumes all functional components have already been allocated and so does not address resource allocation. Second, retiming cannot handle components that contain internal pipeline stages, such as synchronous RAM or pipelined multipliers, which are common in reconfigurable hardware. Third, retiming fails to preserve the initial state of the retimed circuit, thereby requiring difficult transformations to compensate, and which are not guaranteed to work.

Modulo scheduling is a framework for defining algorithms to pipeline innermost loops onto sequential processors. Iterative modulo scheduling (IMS) is an instance of such an algorithm that schedules a loop such that resource conflicts between overlapping iterations are resolved. Each iteration has an identical schedule, and successive iterations are staggered in time by a constant interval known as the initiation interval (II).

IMS is functionally similar to retiming. However, the assumptions about the target are more restrictive than retiming, reflecting the nature of the conventional processor that it targets. In IMS, the clock period is assumed to be fixed, every operation requires an integral number of clock periods in order to produce its result, and the results of operations are written to (and read from) registers on timeslot boundaries.

IMS implicitly uses a slowdown transformation to solve both the cycle weight problem and the resource sharing problem. The average cycle weight of a cycle is defined to be the sum of the propagation delays through all operations on that cycle, divided by the number of registers on the cycles. In slowdown, each register in the original circuit is replaced by a sequence of c registers, producing what is known as a c-slow circuit. The resulting circuit is then retimed to distribute the registers and minimize the clock period. As long as the maximum of the average cycle weights of the c-slow circuit is less than or equal to 1, the retimed, c-slow circuit will be able to execute with the desired clock period of 1. The penalty of slowdown is that if the original circuit were able to accept input values on every cycle, the retimed, c-slow circuit would only able to accept inputs and produce outputs every c cycles. Thus, for a pipelined circuit, only 1/c stages of the pipeline contain valid data at any given time, the remaining stages contain "garbage." Therefore, even though the c-slow circuit can run at a higher frequency, this could be largely or completely offset by the reduced rate of input processing.

The maximum average cycle weight is referred to in IMS as the recurrence-constrained minimum initiation interval, or "recMII." In the absence of resource interference, a loop may be scheduled with an II equal to the recMII. This corresponds to a c-slowdown transformation, with c equal to II, with the same drawbacks as in retiming: inputs are accepted only every II cycles, with only 1/II stages of the pipeline performing useful computation at any given time (although the second drawback is masked to a large degree by aggressive sharing of resources).

Resource contention can make an II equal to recMII unachievable. Sharing issues lead to the concept of a resource-constrained minimum initiation interval, or resMII, which is determined by comparing the loop's operations with the resources available for implementing them. For example, a single resource can be timeshared by II operations, as long as the timeslot modulo II for any one of the operations differs from each of the others.

IMS avoids the initial value problem of retiming. Conceptually, IMS pipelines by adding registers through slicing, rather than by moving registers. However, IMS's lack of register motion may lead to inferior schedules when compared to retiming. This can be compensated in some cases by using retiming as a preprocessing step to IMS.

The IMS algorithm begins with a dependence graph representing the loop computation. The graph is analyzed to determine rec-MII and res-MII. The maximum of the two, called MII, is used as the initial value for II. An empty schedule consisting of discrete timeslots is created. Operations in the dependence graph are prioritized and inserted into a priority queue. Operations are then extracted from the priority queue one at a time and inserted into the schedule in the earliest possible timeslot such that: (1) input values needed by the operation have already been computed; and (2) the operation does not conflict with the modulo constraint of any other operation using the same resource. If no such timeslot exists, the operation is scheduled anyway, with conflicting operations unscheduled and returned to the priority queue. If all operations are successfully scheduled within an acceptable computation bound, the algorithm terminates successfully, otherwise the II is incremented and the scheduling repeated.

Software pipelining algorithms, such as iterative modulo scheduling, can pipeline loops on sequential processors. Such algorithms address issues of resource allocation and handle pipelined components. However, IMS uses a simple integral propagation delay model that may lead to excess registers and power dissipation when applied to hardware synthesis.

A system and method that address the aforementioned problems, as well as other related problems, are therefore desirable.

In various embodiments, the invention generates a pipelined synchronized circuit representation of a program loop. A dependence graph is generated from the program loop. The dependence graph represents operations and registers and connections therebetween. A minimum clock period and initiation interval are determined from the dependence graph. Until a scheduled graph is successfully generated, repeated attempts are made to generate a scheduled graph from operations and registers of the dependence graph using the minimum clock period and the initiation interval. With each failed attempt to generate a scheduled graph, the minimum clock period is increased prior to the next attempt to generate a scheduled graph.

It will be appreciated that various other embodiments are set forth in the Detailed Description and Claims which follow.

Various aspects and advantages of the invention will become apparent upon review of the following detailed description and upon reference to the drawings in which.

Figure 5:
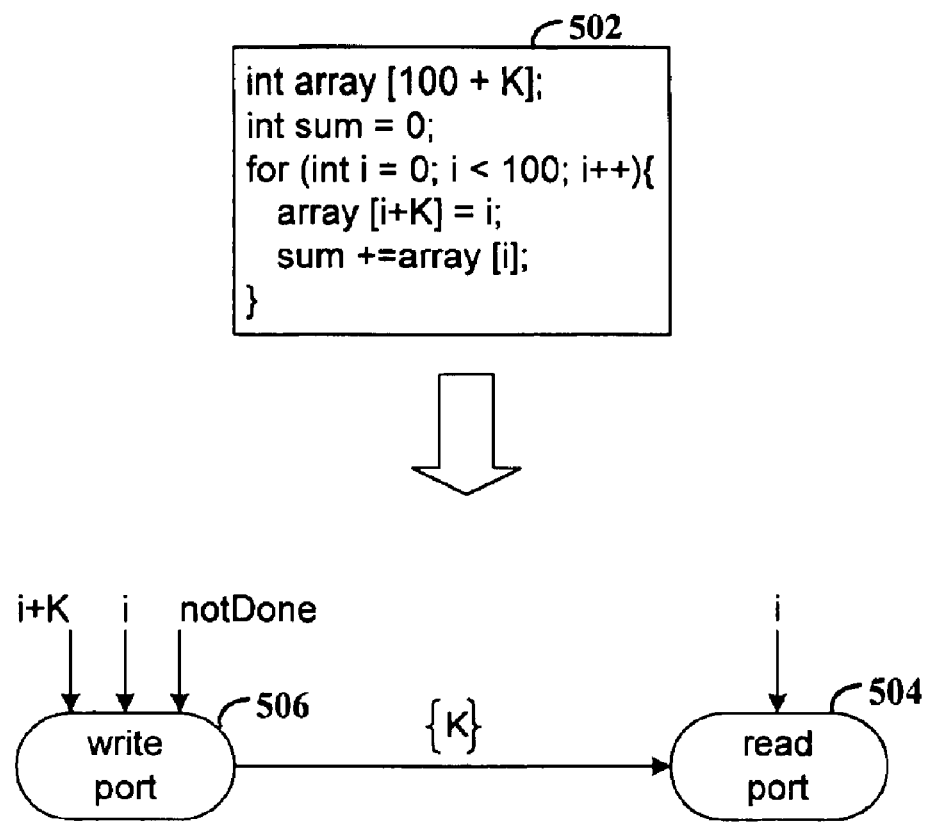
Figure 6:
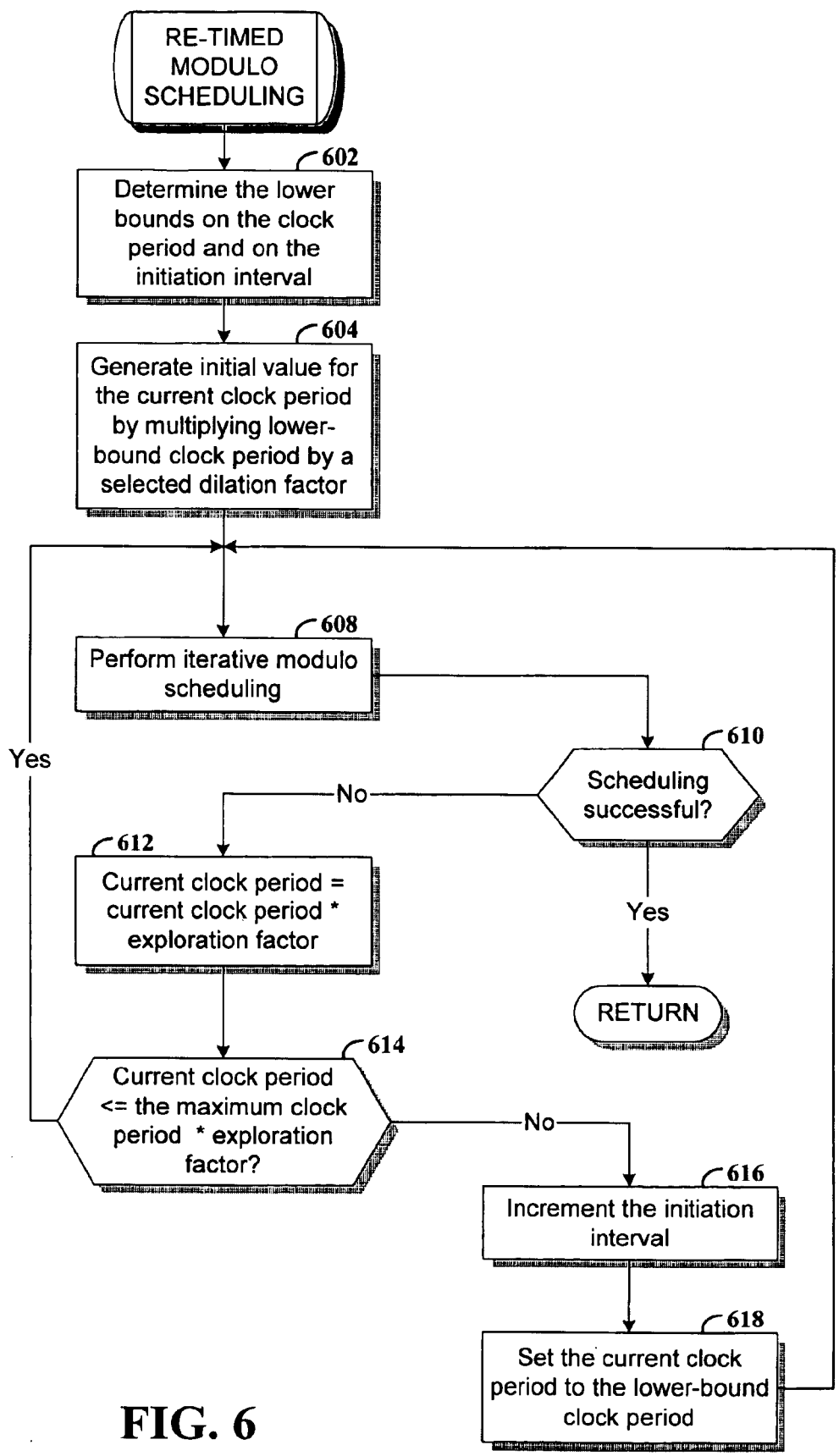
Figure 7A:
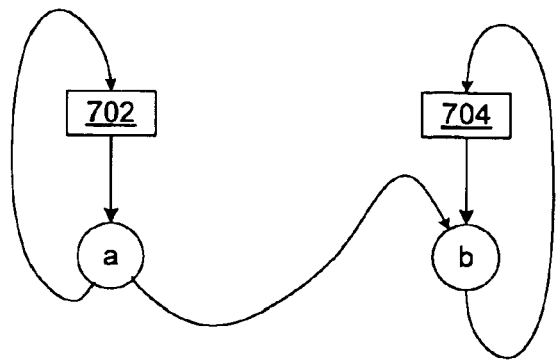
Figure 7B:
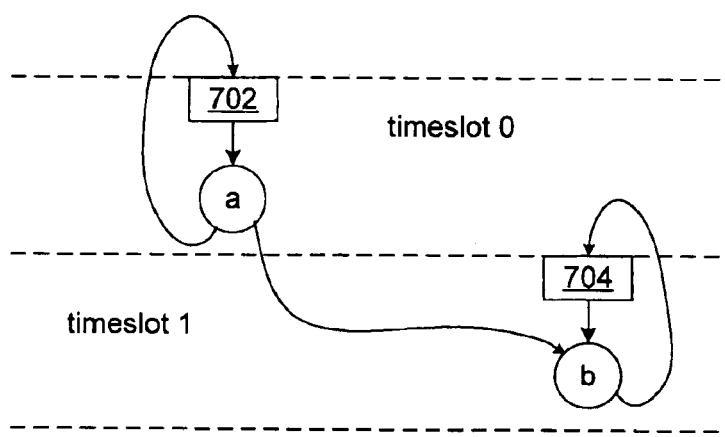
Figure 7C:
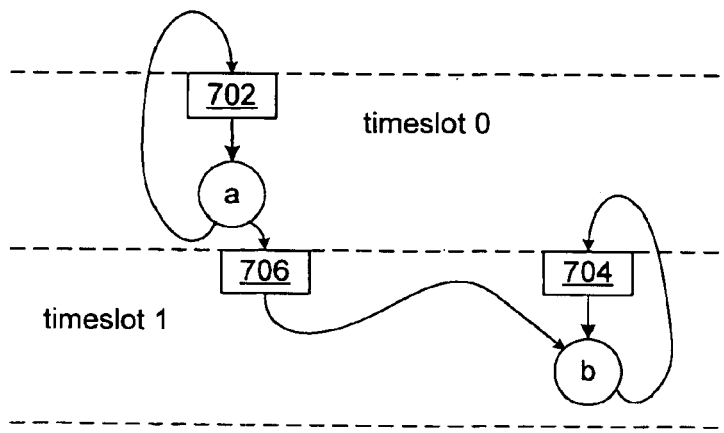
Figure 8:
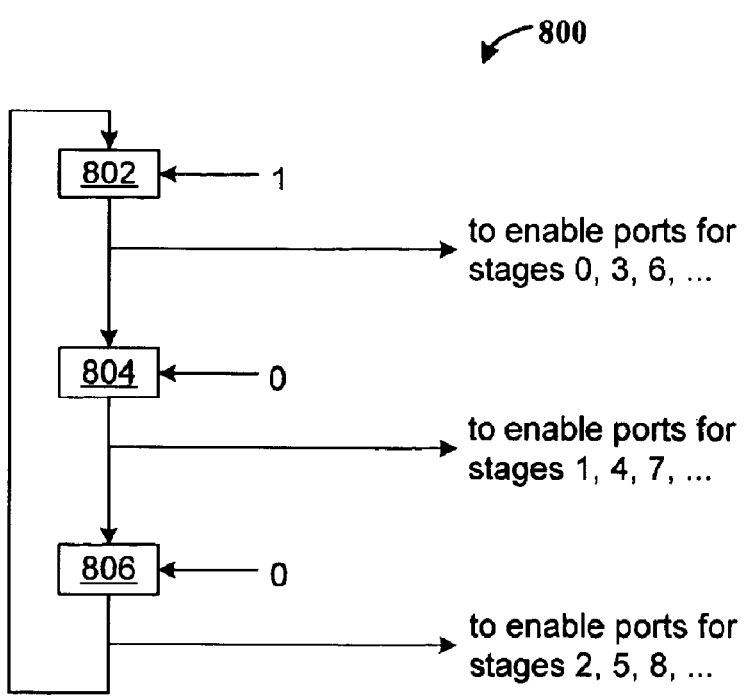

FIG. 5 which illustrates the transformation of afor loop with array accesses to a partially complete dependence graph;

FIG. 6 is a flowchart of an example process for performing re-timed modulo scheduling in accordance with one embodiment of the invention;

FIGS. 7A, 7B, and 7C illustrate the transformation of an initial dependence graph through scheduling and register insertion; and FIG. 8 illustrates an example ring counter for sequencing stages of a pipeline where the initiation interval is greater than 1.

The embodiments of the process described herein may be referred to as "retimed modulo scheduling". The process generally explores the pipeline design space in search of a pipeline implementation that best meets the given constraints. This is necessary because it is difficult to predict the performance of a pipeline without actually implementing the pipeline. However, for the "as fast as possible" constraint, the fastest possible pipeline is generated without exploration. The present invention performs allocation during scheduling, handles components containing internal pipeline stages, such as synchronous RAM or pipelined multipliers, and preserves the initial state of the circuit without requiring difficult transformations or circuit modifications. In addition, the present invention handles non-integral propagation delays.

Figure 1:
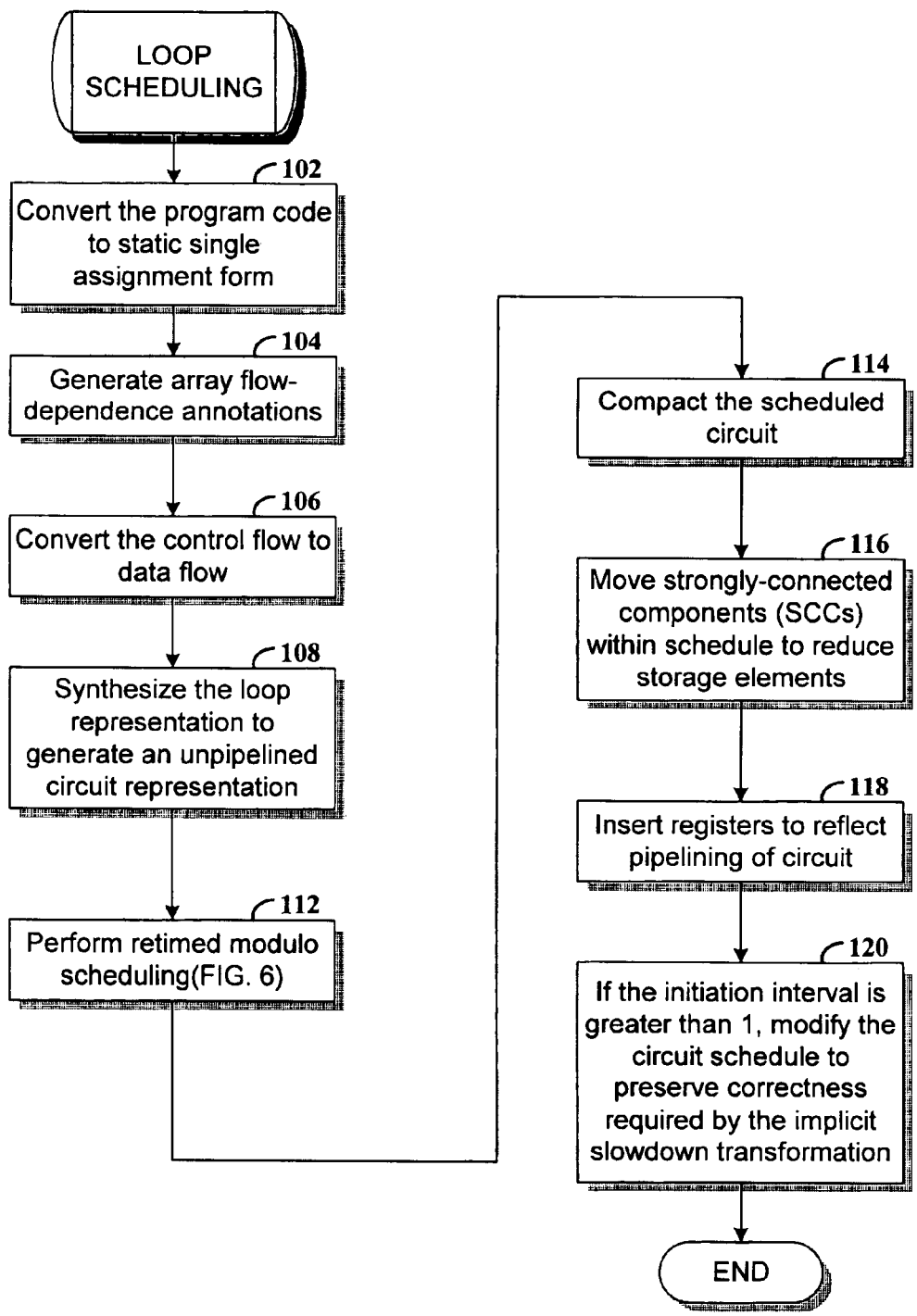
FIG. 1 is a flow chart of an example process for generating a schedule of operations from an input source code program loop in accordance with one embodiment of the invention.

FIG. 1 is a flow chart of an example process for generating a schedule of operations from an input source code program loop in accordance with one embodiment of the invention. The loop to be processed is assumed to have been optimized and transformed to expose a suitable amount of parallelism and to minimize communication, using, for example, unimodular transformations, tiling, architectural retiming and other known techniques.

Figure 2:
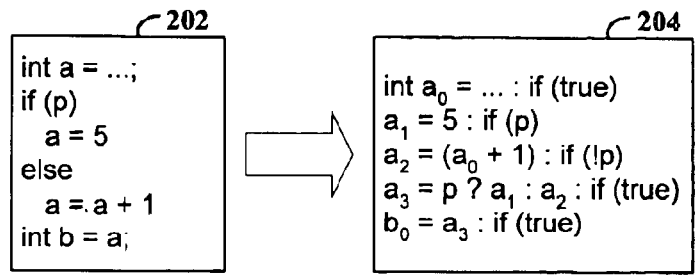
FIG. 2 illustrates the transformation of a fragment of source program code into predicated static single assignment (PSSA) form.

The loop is first preprocessed in accordance with steps 102–108. Scalar output-and anti-dependences are removed by conversion to static single assignment (SSA) form (step 102); array flow-dependence annotations are generated using dependence analysis (step 104); and Control flow is converted to data flow with predicates using if-conversion (step 106). FIG. 2 illustrates the transformation of source program code 202 into predicated static single assignment (PSSA) form 204. The PSSA form eliminates the control flow of the if statement in code 202 and exposes all dependences. In the example PSSA form 204, both branches of the if statement are speculatively executed.

The PSSA form is then synthesized for the target platform, resulting in an un-pipelined circuit representation (step 108). Generally, predicates in the original loop representation are replaced with register enable signals and write port enable signals in the circuit representation. Each array is generally replaced with an associated RAM. Array dependence annotations are attached to the corresponding read ports and write ports in the circuit. Further explanation of steps 102–108 is provided in the description of FIGS. 3, 4, and 5.

At this point, the circuit representation is ready for retimed modulo scheduling, (step 112). The retimed modulo scheduling process analyzes the circuit representation to determine lower bounds on the clock period and on the initiation interval. The initial clock period is set to the computed lower bound multiplied by a selected dilation factor (greater than or equal to 1.0). The retimed modulo scheduling process re-attempts scheduling and allocation with an increased clock period if the scheduling and allocation fails with the initial clock period. If the process fails to generate a acceptable schedule with repeated increases in the clock period, the process reduces the clock period the initial input value, the II is incremented, and the process of step 112 is repeated until scheduling succeeds.

Steps 114–120 further optimize the scheduled circuit representation resulting from the process of step 112. The scheduled circuit representation is compacted in an attempt to reduce the number of pipeline stages (step 114). Fewer stages require fewer pipeline registers. In some cases it is possible to reduce the number of pipeline stages by reducing the slack between each strongly connected component (SCC) and all the operations that feed it.

The slack of a dependence edge is defined to be the difference between the time that the edge's value is consumed and the time that it is produced. If the slack of all edges feeding an SCC equals or exceeds 1.0, then potentially that SCC can be moved to an earlier point in the schedule while preserving the pipeline's functionality. Similarly, if the slack of all outputs leaving an SCC equals or exceeds 1.0, the component could, perhaps, be moved to a later point in the schedule.

When moving an SCC either forwards or backwards, the correct operation of the pipeline must be preserved, considering that moving an SCC can potentially upset the resource time-sharing generated by the modulo scheduling. To avoid this, the resource usage of the SCC is examined. If the SCC does not share any resources with the rest of the circuit, it may be safely moved an integral number of timeslots within the bounds dictated by the slack. Otherwise, the SCC may only be shifted by a multiple of the initiation interval.

Schedule compaction simply involves minimizing the slack on all input edges to all SCCs, moving each SCC backwards to its earliest legal point in the schedule. Known pipeline compaction techniques are suitable in different embodiments of the invention.

SCCs are moved within the schedule to reduce the number of required storage elements (e.g., flip-flops) in the circuit, thereby reducing both area and power (step 116). Although schedule compaction can reduce the number of flip-flops in the final implementation, there remains additional potential for reduction by moving SCCs within the compacted schedule. An example process for moving SCCs within the compacted schedule is described in the application/patent/docket number 100200067-1, entitled, "REDUCTION OF STORAGE ELEMENTS IN SYNTHESIZED SYNCHRONOUS CIRCUITS," to Snider, filed on Jun. 19, 2002, assigned to the assignee of the present application/patent, and incorporated herein by reference. The process recognizes that if slack exists on all inputs and outputs, the SCC may moved either earlier or later, with one direction usually more advantageous than the other.

Registers are inserted into the circuit to reflect the pipelining of the circuit (step 118). If the II is greater than 1, the scheduled circuit representation is slightly modified to preserve correctness required by the implicit slowdown transformation (step 120). The example of FIGS. 7A, 7B, and 7C illustrate insertion of registers, and the example of FIG. 8 illustrates a sequencer that must be synthesized as part of further modifying the scheduled circuit representation if the II is greater than 1.

Figure 3:
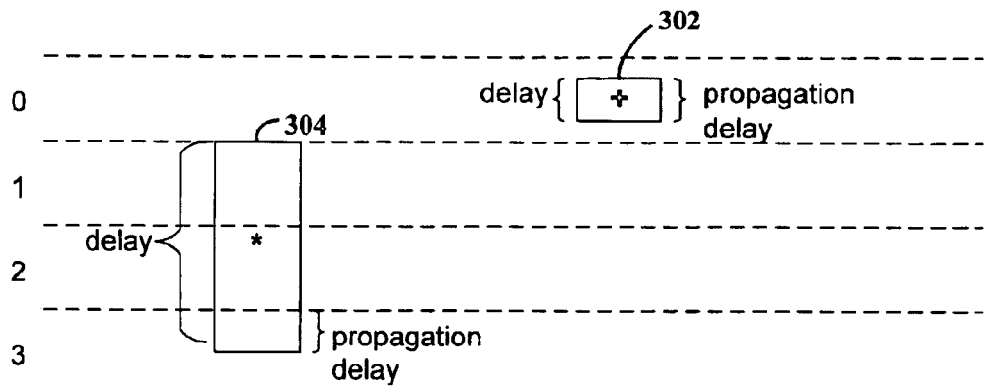
FIG. 3 illustrates an example timing model for multiplication and addition operations.
Figure 4:
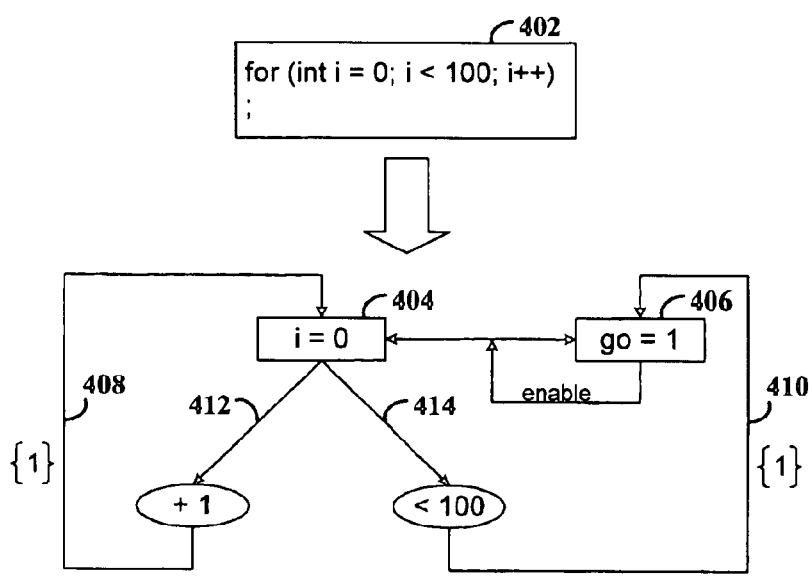
FIG. 4 illustrates the transformation of afor loop to a dependence graph.

FIGS. 3, 4, and 5 are described below to further explain the preprocessing performed on the program loop in steps 102-108. The preprocessing generates a dependence circuit representation that is similar to the dependence graph used by many compilers, but differs in its timing model and in the manner that recurrences are represented. Nodes in the dependence circuit representation represent primitive operations in the target platform. When targeting an FPGA, for example, a node might represent a ripple adder, multiplexer, lookup table (LUT), block RAM, register, or another primitive. Each node is tagged with two attributes, internalPipelineStages and propagationDelay, that are used in determining how much time is required for the operation to execute and in scheduling the operation.

The internalPipelineStages attribute of a node indicates the number of internal pipeline stages in the operation. For LUTs, adders and other combinational primitives, the value is 0; for registers the value is 1; and for more complex components, such as synchronous RAMs or pipelined multipliers, the value is greater than or equal to 1. An operation with no internal pipeline stages may be scheduled to begin execution at any time within a clock period or timeslot, as long as it completes before the end of that period. A pipelined operation, however, may only be scheduled to begin at the start of a timeslot. The value of the propagationDelay attribute is a real number that represents the amount of time needed for the operation to complete execution as measured from the triggering of the last internal pipeline stage (for pipelined operations) or from the time the operation was initiated (for non-pipelined operations). An operation cannot be scheduled if the value of the propagationDelay is greater than the clock period.

FIG. 3 illustrates an example timing model for multiplication and addition operations. The total execution time of an operation, called the delay, is determined by the values of the propagationDelay and internalPipelineStages attributes and the clock period. An un-pipelined operation such as "+"(block 302) has a delay equal to its propagation delay. These types of operations may be scheduled to begin at any time within a timeslot, as long as the operation completes before the end of the timeslot. Note that timeslots are labeled 0–3. A pipelined operation such as "*" (block 304) may only start at the beginning of a timeslot and has a delay equal to:

(internalPipelineStages−1)*clockPeriod+propagationDelay

The circuit representation includes nodes and edges. Nodes represent operations and edges represent data flow from a source operation to a sink operation. Each edge has an associated distance attribute that represents the number of iterations that the data value crosses between its production and its consumption. To illustrate the concept of distance, consider the following loop:

```
int i = 0;
while (someTest) {
    int j = i * 2;
    i = j + 1;
}
```

The first operation (multiplication) produces a value that is consumed by the second operation (addition) in the same iteration, so the edge representing this data flow is assigned a distance of 0. The value produced by the addition, though, is not consumed by the multiplication until the following iteration. The variable i stores the result across the iteration boundary, and the corresponding edge is assigned a distance of 1. This flow of a data value between iterations, called a recurrence, is represented in the dependence circuit representation by a combination of distance-tagged edges and explicit registers to hold the data. It will be appreciated that in iterative modulo scheduling registers are represented implicitly.

FIG. 4 illustrates the transformation of a for loop 402 to a dependence graph. The for loop counts integers from 0–99 Two registers are used. Register 404 stores the value of i, which is initialized to 0, and register 406 stores a go bit to implement the sequencer for the circuit. The output signal from register 406 disables the i register and itself once the proper number of iterations have executed. Edges 408 and 410 have associated distance attributes with values equal to 1, which indicates that values are provided to the next iteration. Edges 412 and 414 have distances values of 0 because values are provided only to the current iteration.

FIG. 5 which illustrates the transformation of a for loop 502 with array accesses to a partially complete dependence graph. An array is mapped to a RAM, with read and write accesses represented by read port and write port operations 504 and 506, respectively. The recurrence is represented by an edge from the write port to the read port, annotated with the distance K because the value written in iteration x is not read until iteration x+K.

Registers serve two different functions in pipelined circuits, and the distinction is noteworthy because it impacts the pipelining process. As noted above, a register in the initial dependence circuit representation carries a data value from one iteration to a later iteration. This register is called a recurrence register. However, a register can also be used to delay the propagation of data within the same iteration. A register used for this purpose is called a delay register. Delay registers are inserted to pipeline a signal.

The registers within pipelined operations are generally delay registers, which are intended to reduce the clock period of the computation while delivering a result to the same iteration. One exception is that the first register in the pipelined operation may serve the function of a recurrence register if the input value was generated for consumption in a later iteration.

In the dependence circuit representation, recurrence registers and delay registers are represented by the associated distance distances attributes of the input edges. Recurrence registers have input edges with distance greater than 0, and delay registers have input edges with distance equal to 0. Registers within pipelined operations are delay registers, except that the first register may serve as a recurrence register if the input edge to the operation has a distance greater than 0.

The re-timed modulo scheduling process may be viewed as a modification of the known iterative modulo scheduling (IMS). The modifications include: treating the clock period as a variable rather than as a constant; scheduling of operations onto continuous time rather than discrete timeslots; explicitly representing recurrence registers (but not delay registers) in the dependence circuit; and using real rather than integer scheduling priorities for operations.

FIG. 6 is a flowchart of an example process for performing re-timed modulo scheduling in accordance with one embodiment of the invention. The process takes a single parameter, clockDilation, which is used by an outer design-space-exploration loop to force the process to consider longer clock periods, and hence shorter pipelines, than the minimum possible.

The process begins by calculating the minimum clock period the lower bound values of the clock period and initiation interval. (step 602). The determinative factor in clock period selection is the II. Generally, a smaller II is better because a small II minimizes the number of registers created by the slowdown transformation. Once the II has been determined, a lower bound on the clock period needed for maximum throughput can be determined.

In order to maximize the throughput of the loop, it is desirable to make II as small as possible. The minimum possible II, called MII, is the larger of ResMII and RecMII. ResMII reflects the impact of contention for limited resources on the ability to create a tight schedule. This is less an issue in reconfigurable or custom hardware than in sequential processors because there is considerably less resource sharing in reconfigurable targets. The reduced sharing stems not only from the abundance of resources, but also from the high overhead associated with resource sharing. For example, in many FPGAs a multiplexer is as expensive as an adder. Thus, attempting to share an adder by multiplexing its inputs offers no advantage. Resource conflicts appear, however, in attempting to allocate the typically small number of read ports and write ports on internal RAMs to multiple RAM accesses within an iteration. In that situation, sharing is often unavoidable. ResMII may be computed as in iterative modulo scheduling.

RecMII reflects the impact of feedback (recurrences) on the ability to create a tight schedule. It may be computed by modifying a known function for computing the minimum permissible time interval between every pair of operations, replacing all references to the "delay" of a node with the number of "internalPipelineStages" for that node.

The selected clock period for pipelining a computation results in a tradeoff between performance and area. Shorter clock periods tend to the increase the throughput of a circuit to a point, but will also tend to increase the number of pipeline stages. This increases the number of flip-flops in the final implementation. At some point, however, further decreases in the clock period offer no performance gain and can degrade performance as the circuit spreads in area to accommodate additional flip-flops.

The minimum clock period, MinCP, is calculated in a manner analogous to the computation of MII. MinCP is the maximum of the resource-constrained minimum clock period, ResMinCP, and the recurrence-constrained minimum clock period, RecMinCP.

ResMinCP is the maximum of: (1) the largest propagationDelay of any operation in the circuit; (2) the largest minimum clock period required by any pipelined component; and (3) the smallest clock period that can be provided by the system clock.

RecMinCP is a function of the initiation interval. Conceptually RecMinCP is a measure of how evenly registers can be redistributed around each elementary circuit within the design such that the maximum propagation delay from register output to register input is minimized. In retiming a synchronous circuit containing only registers and non-pipelined operations, a lower bound on the clock period can be derived by spreading the registers around the circuit. For example, let C represent the set of all elementary circuits within a design, with c used to represent a member of that set. Let the function propagationDelay(c) denote the sum of the propagation delays for all operations in elementary circuit c, and let the function registers(c) represent the number of registers in circuit c. It is understood that, for a synchronous circuit before slowdown, $$\text{RecMin}CP = \text{Max}(\text{propagationDelay}(c)/(\text{II}^*\text{registers}(c)))$$

where the function Max is evaluated over all circuits c that are elements of C, and II is the desired slowdown factor.

Pipelined operations complicate computation of RecMinCP because the registers within such operations are fixed in place and unavailable for distribution around the loop. Furthermore, internal registers generally act as delays, not as mechanisms for implementing recurrences. The only registers available for distribution within the loop are recurrence registers (there must always be at least one), which are recognized by the non-zero distances on their input edges. Thus, determining RecMinCP focuses on the sum of the distances around the loop, not the registers. Specifically, let dist(c) represent the sum of distances for all edges within an elementary circuit c. RecMinCP is reformulated to handle both pipelined and unpipelined operations as:

$$\text{RecMin}CP = \text{Max}(\text{propagationDelay}(c)/(\text{II}^*\text{dist}(c)))$$

where the function Max is evaluated for all circuits c that are elements of C.

Similarly, for a recurrence-constrained upper bound on the minimum clock period, RecMaxCP, is:

RecMaxCP=RecMinCP+Max(propagationDelay(op))

where the function Max is evaluated over all operations op that are elements of O, which is the set of operations in all elementary circuits.

An initial value is generated for the current clock period by multiplying the lower-bound clock period by a selected dilation factor (step 604). The choice of a dilation factor is a tradeoff between speed and area. A small value (1.0) will produce the fastest circuit, but also the largest one. Larger values (e.g., up to 10 or 20 are not unreasonable) will generally produce smaller, slower circuits. The dilation factor is used to explore the pipeline design space if the user needs to trade off speed and area. In that case the user might pick a wide variety of dilation factors (for example, maybe all integral values from 1.0 to 10.0) and the process of steps 604–618 is performed using the selected dilation factors. If the user wants the fastest possible circuit and area is not a concern, the dilation factor can be set to 1.0 and exploration of other dilation factors is not needed. The dilation factor forces the scheduling process to consider longer clock periods. It will be appreciated that longer clock periods imply fewer pipeline stages, which imply fewer registers, which imply smaller area.

A modified IMS process is then applied to the circuit representation (step 608). The IMS process is modified in that a known IMS process is adapted to handle non-integral propagation delays. Because operations are scheduled onto a continuous timeline rather than discrete timeslots, some modifications to the conventional IMS process are made. First, the time scale is normalized such that the current clock period has the value of 1.0. Thus the formula for the delay of an operation becomes:

delay(op)=max(0,pipelineStages(op)−1)+propagationDelay(op)/clockPeriod

There are two constraints applied to computing the earliest and latest possible scheduling time for an operation. First, pipelined operations can only start at integer valued times (1.0, 2.0, . . . ). Second, unpipelined operations can start at any time, as long as the operations complete before the end of a timeslot. For example, an unpipelined operation with a normalized propagation delay of 0.6 can not be scheduled later than 0.4 within any timeslot.

Because the scheduling priority of an operation is based on the schedule times of predecessor operations, the scheduling priority becomes a real value, and the scheduling priority queue sorts operations based on their real-valued priorities.

If the scheduling is successful (decision step 610), the process returns to the process of FIG. 1. Otherwise, the current clock period is adjusted by multiplying it by a small "exploration" factor, for example, 1.1. (step 612). If the scheduling fails, it is because either the clock period or II is too small. Because it generally preferred to keep the II as small as possible, the clock period is increased slightly and scheduling is again attempted, (decision step 614) as long as the current clock period is less than the maximum clock period*the exploration factor (RecMaxCP). If scheduling still fails at the upper bound of the clock period, it is assumed that the problem lies with the II. The II is incremented (step 616), and the clock period is reset to its initial minimum value (step 618). The entire process is repeated until scheduling succeeds. It will be appreciated that the process of exploring the clock period could be accelerated with a binary search.

FIGS. 7A, 7B, and 7C illustrate the transformation of an initial dependence graph through scheduling and register insertion (step 118, FIG. 1). FIG. 7A illustrates an example circuit representation prior to scheduling. Operation a receives input from register 702, and operation b receives input from operation a and from register 704 (FIG. 7A). Scheduling causes the results of some operations to be consumed in timeslots other than the one in which they were produced (FIG. 7B). When this happens, delay registers are inserted to delay the values to their proper times (FIG. 7C). After scheduling, register 702 and operation a are assigned to timeslot 0, and register 704 and operation b are assigned to timeslot 1. In order to deliver the output of operation a to operation b at the proper time, register 706 is inserted at the beginning of timeslot 1.

FIG. 8 illustrates an example ring counter for sequencing stages of a pipeline where the initiation interval is greater than 1. If the II is greater than one, only 1/II stages of the pipeline are computing useful data at any given time. The pipeline generated to this point, though, potentially enables all stages on every cycle. This presents a problem with state variables, particularly those stored in RAMs, because garbage may be written into state variables during the "off" cycles, thereby potentially corrupting the computation. This is corrected by ANDing an additional signal with the enables of recurrence registers and RAM write ports.

Sequencer 800 is a ring counter having a length equal to the II, which is 3 in the example. A bit having a value 1 is circulated through registers 802, 804, and 806. The output signals from the registers are ANDed with signals originally destined for enable ports of RAM write ports and enable ports of recurrence registers; the enable ports are drive instead by the ANDed signals. In the example sequencer, a recurrence register in stage 2 can be enabled in cycles 2, 5, 8, etc. This prevents garbage data from being written into state variables in cycles when the computation is not active.

The present invention is believed to be applicable to a variety of synthesis applications and has been found to be particularly applicable and beneficial in generating pipelined synchronous circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a pipelined synchronized circuit representation of a program loop, comprising:

generating a dependence graph from the program loop, the dependence graph representing operations and registers and connections therebetween;

determining a minimum clock period and initiation interval from the dependence graph, and establishing a current minimum clock period as a function of the minimum clock period and establishing the initiation interval as a current initiation interval; and iteratively attempting to generate a scheduled graph from operations and registers of the dependence graph using the current minimum clock period and the current initiation interval as scheduling constraints, and if an attempt to generate a scheduled graph fails in an iteration, then increasing the current minimum clock period for a next iteration.

2. The method of claim 1, further comprising:
if attempts to generate a scheduled graph fail with increasing current minimum clock periods, then,
resetting the current minimum clock period to the minimum clock period;
increasing the current initiation interval; and
repeating the step of iteratively attempting to generate a scheduled graph and the steps of resetting the current minimum clock period and increasing the current initiation interval until a scheduled graph is generated.

3. The method of claim 2, further comprising compacting the scheduled graph.

4. The method of claim 3, wherein the scheduled graph is divided into a plurality of time-ordered timeslots that are bounded by storage elements, the method further comprising selectively moving operations between timeslots as a function of storage element requirements of possible movements.

5. The method of claim 4, further comprising inserting registers between selected operations in the scheduled graph.

6. The method of claim 5, further comprising if the initiation interval is greater than 1, generating a controller for selectively enabling the operations and registers in the timeslots.

7. The method of claim 1, further comprising:
converting the program loop to static single assignment (SSA) form;
generating array flow-dependence annotations of the SSA form of the program loop;
converting control flow of the SSA form to data flow graph with predicates; and
synthesizing the data flow graph into the dependence graph.

8. The method of claim 1, wherein increasing the current minimum clock period includes multiplying the current minimum clock period by a selected value.

9. The method of claim 1, wherein the initial value of the current minimum clock period is obtained by multiplying the minimum clock period by a selected dilation factor that is greater than 1.

10. A method for generating a plurality of pipelined synchronized circuit representations of a program loop, comprising:
(a) generating a dependence graph from the program loop, the dependence graph representing operations and registers and connections therebetween;
(b) determining a minimum clock period and initiation interval from the dependence graph and establishing a current minimum clock period by multiplying the minimum clock period by a selected dilation factor and establishing the initiation interval as a current initiation interval;
(c) iteratively attempting to generate a scheduled graph from operations and registers of the dependence graph using the current minimum clock period and the current initiation interval as scheduling constraints, and if an attempt to generate a scheduled graph fails in an iteration, then increasing the current minimum clock period for a next iteration; and
(d) repeating steps (b)–(c) using a plurality of different dilation factors.

11. The method of claim 10, further comprising:
if attempts to generate a scheduled graph fail with increasing current minimum clock periods, then,
resetting the current minimum clock period to the minimum clock period;
increasing the current initiation interval; and
repeating the step of iteratively attempting to generate a scheduled graph and the steps of resetting the current minimum clock period and increasing the current initiation interval until a scheduled graph is generated.

12. The method of claim 11, further comprising compacting the scheduled graph.

13. The method of claim 12, wherein the scheduled graph is divided into a plurality of time-ordered timeslots that are bounded by storage elements, the method further comprising selectively moving operations between timeslots as a function of storage element requirements of possible movements.

14. The method of claim 13, further comprising inserting registers between selected operations in the scheduled graph.

15. The method of claim 14, further comprising if the initiation interval is greater than 1, generating a controller for selectively enabling the operations and registers in the timeslots.

16. The method of claim 10, further comprising:
converting the program loop to static single assignment (SSA) form;
generating array flow-dependence annotations of the SSA form of the program loop;
converting control flow of the SSA form to data flow graph with predicates; and
synthesizing the data flow graph into the dependence graph.

17. The method of claim 10, wherein increasing the current minimum clock period includes multiplying the current minimum clock period by a selected value.

18. An apparatus for generating a pipelined synchronized circuit representation of a program loop, comprising:
means for generating a dependence graph from the program loop, the dependence graph representing operations and registers and connections therebetween;
means for determining a minimum clock period and initiation interval from the dependence graph and establishing a current minimum clock period as a function of the minimum clock period and establishing the initiation interval as a current initiation interval; and
means for iteratively attempting to generate a scheduled graph from operations and registers of the dependence graph using the current minimum clock period and the current initiation interval as scheduling constraints, and if an attempt to generate a scheduled graph fails in an iteration, then increasing the current minimum clock period for a next iteration.

19. An article of manufacture, comprising:
a computer-readable medium configured with program code for causing a computer to perform the steps of,
generating a dependence graph from the program loop, the dependence graph representing operations and registers and connections therebetween;
determining a minimum clock period and initiation interval from the dependence graph, and establishing a current minimum clock period as a function of the minimum clock period and establishing the initiation interval as a current initiation interval; and
iteratively attempting to generate a scheduled graph from operations and registers of the dependence graph using the current minimum clock period and the current initiation interval as scheduling constraints, and if an attempt to generate a scheduled graph fails in an iteration, then increasing the current minimum clock period for a next iteration.

* * * * *